United States Patent
Wu et al.

(10) Patent No.: US 11,018,185 B1
(45) Date of Patent: May 25, 2021

(54) LAYOUT PATTERN FOR MAGNETORESISTIVE RANDOM ACCESS MEMORY

(71) Applicant: UNITED MICROELECTRONICS CORP., Hsin-Chu (TW)

(72) Inventors: Yi-Ting Wu, Tainan (TW); Jian-Jhong Chen, Tainan (TW); Po-Chun Yang, Tainan (TW); Jhen-Siang Wu, Kaohsiung (TW); Yung-Ching Hsieh, Tainan (TW); Bo-Chang Li, Tainan (TW); Jen-Yu Wang, Tainan (TW); Cheng-Tung Huang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/746,974

(22) Filed: Jan. 20, 2020

(30) Foreign Application Priority Data

Dec. 13, 2019 (CN) .......................... 201911279907.5

(51) Int. Cl.
*H01L 27/22* (2006.01)
*H01L 43/08* (2006.01)
*H01L 43/02* (2006.01)

(52) U.S. Cl.
CPC ............ *H01L 27/222* (2013.01); *H01L 43/02* (2013.01); *H01L 43/08* (2013.01)

(58) Field of Classification Search
CPC .......... H01L 27/22; H01L 43/02; H01L 43/08
USPC ........................................................ 257/421
See application file for complete search history.

(56) References Cited

U.S. PATENT DOCUMENTS

| 7,508,700 | B2 | 3/2009 | Zhong et al. | |
| 2012/0063216 | A1* | 3/2012 | Fujita | G11C 5/025 365/158 |
| 2012/0281461 | A1* | 11/2012 | Asao | G11C 11/1659 365/158 |
| 2020/0212030 | A1* | 7/2020 | Chu | H01L 43/12 |

OTHER PUBLICATIONS

Chu, the specification, including the claims, and drawings in the U.S. Appl. No. 16/255,786, filed Jan. 23, 2019.

\* cited by examiner

*Primary Examiner* — Jami Valentine Miller
(74) *Attorney, Agent, or Firm* — Winston Hsu

(57) ABSTRACT

A layout pattern for magnetoresistive random access memory (MRAM) includes a first magnetic tunneling junction (MTJ) pattern on a substrate, a second MTJ pattern adjacent to the first MTJ pattern, and a third MTJ pattern between the first MTJ pattern and the second MTJ pattern. Preferably, the first MTJ pattern, the second MTJ pattern, and the third MTJ pattern constitute a staggered arrangement.

8 Claims, 5 Drawing Sheets

A ←————————————→ A'

B ←————————————→ B'

LAYOUT PATTERN FOR MAGNETORESISTIVE RANDOM ACCESS MEMORY

BACKGROUND OF THE INVENTION

1. Field of the Invention

The invention relates to a layout pattern for magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a layout pattern for magnetoresistive random access memory (MRAM) includes a first magnetic tunneling junction (MTJ) pattern on a substrate, a second MTJ pattern adjacent to the first MTJ pattern, and a third MTJ pattern between the first MTJ pattern and the second MTJ pattern. Preferably, the first MTJ pattern, the second MTJ pattern, and the third MTJ pattern constitute a staggered arrangement.

According to an embodiment of the present invention, the third MTJ pattern is disposed along a first direction relative to the first MTJ pattern and the second MTJ pattern is disposed along a second direction relative to the third MTJ pattern.

According to an embodiment of the present invention, the second MTJ pattern is disposed along a third direction relative to the first MTJ pattern.

According to an embodiment of the present invention, an angle included by the first direction and the third direction is less than 90 degrees.

According to an embodiment of the present invention, an angle included by the second direction and the third direction is less than 90 degrees.

According to an embodiment of the present invention, the first direction, the second direction, and the third direction together constitute a triangle.

According to an embodiment of the present invention, a fourth MTJ pattern is disposed along the second direction relative to the first MTJ pattern.

According to an embodiment of the present invention, the fourth MTJ pattern is disposed along the first direction relative to the second MTJ pattern.

According to an embodiment of the present invention, the first MTJ pattern, the second MTJ pattern, the third MTJ pattern, and a fourth MTJ pattern together constitute a rhombus.

According to an embodiment of the present invention, a distance between the first MTJ pattern and the second MTJ pattern is different from a distance between the third MTJ pattern and the fourth MTJ pattern.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
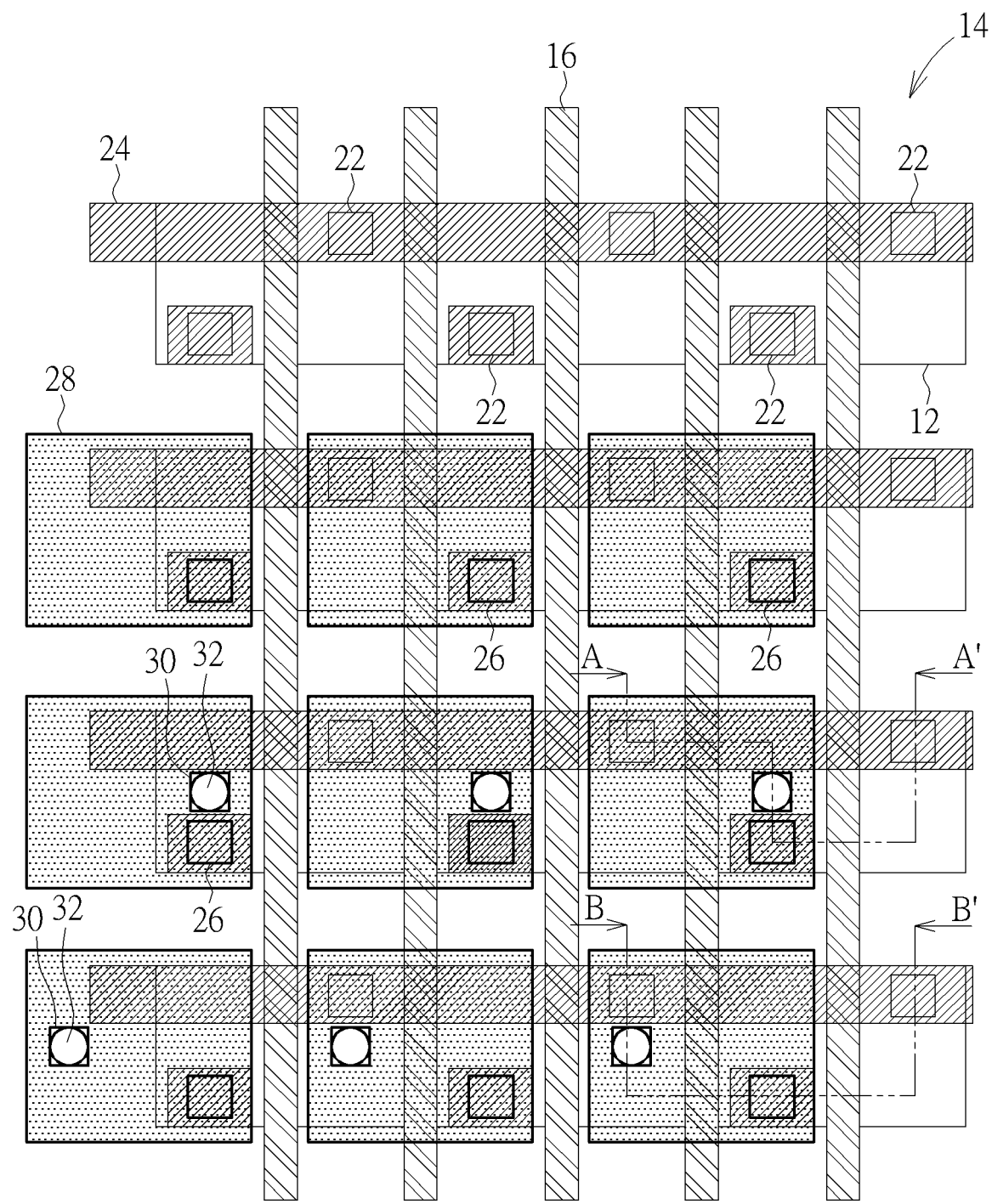
FIG. 1 illustrates a top view of a semiconductor device according to an embodiment of the present invention.
Figure 2:
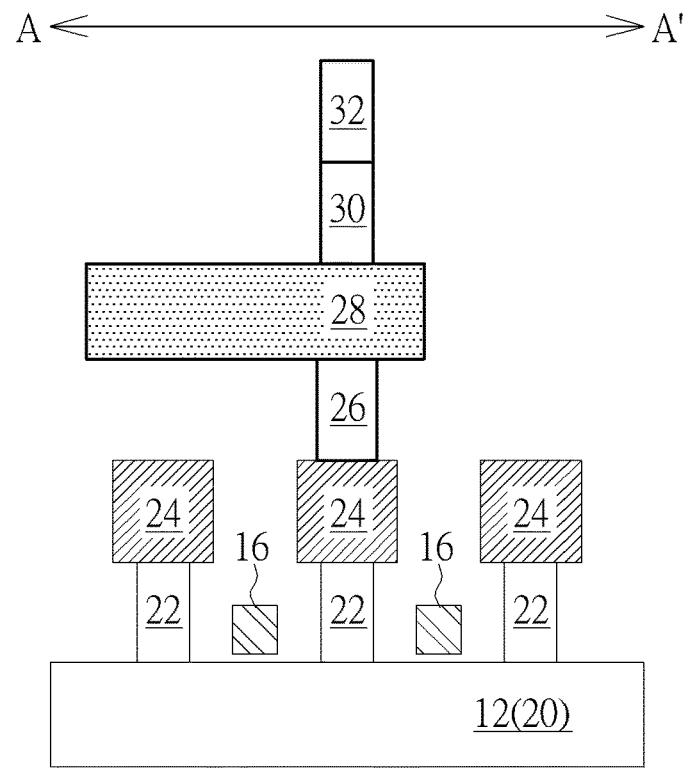
FIG. 2 illustrates cross-sectional views of FIG. 1 along the sectional lines AA' and BB'.
Figure 2:
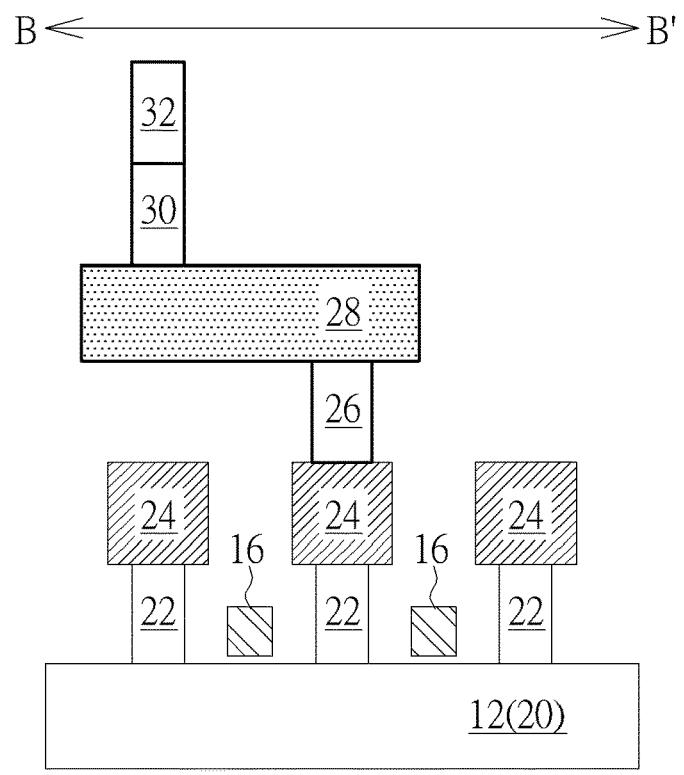
Figure 3:
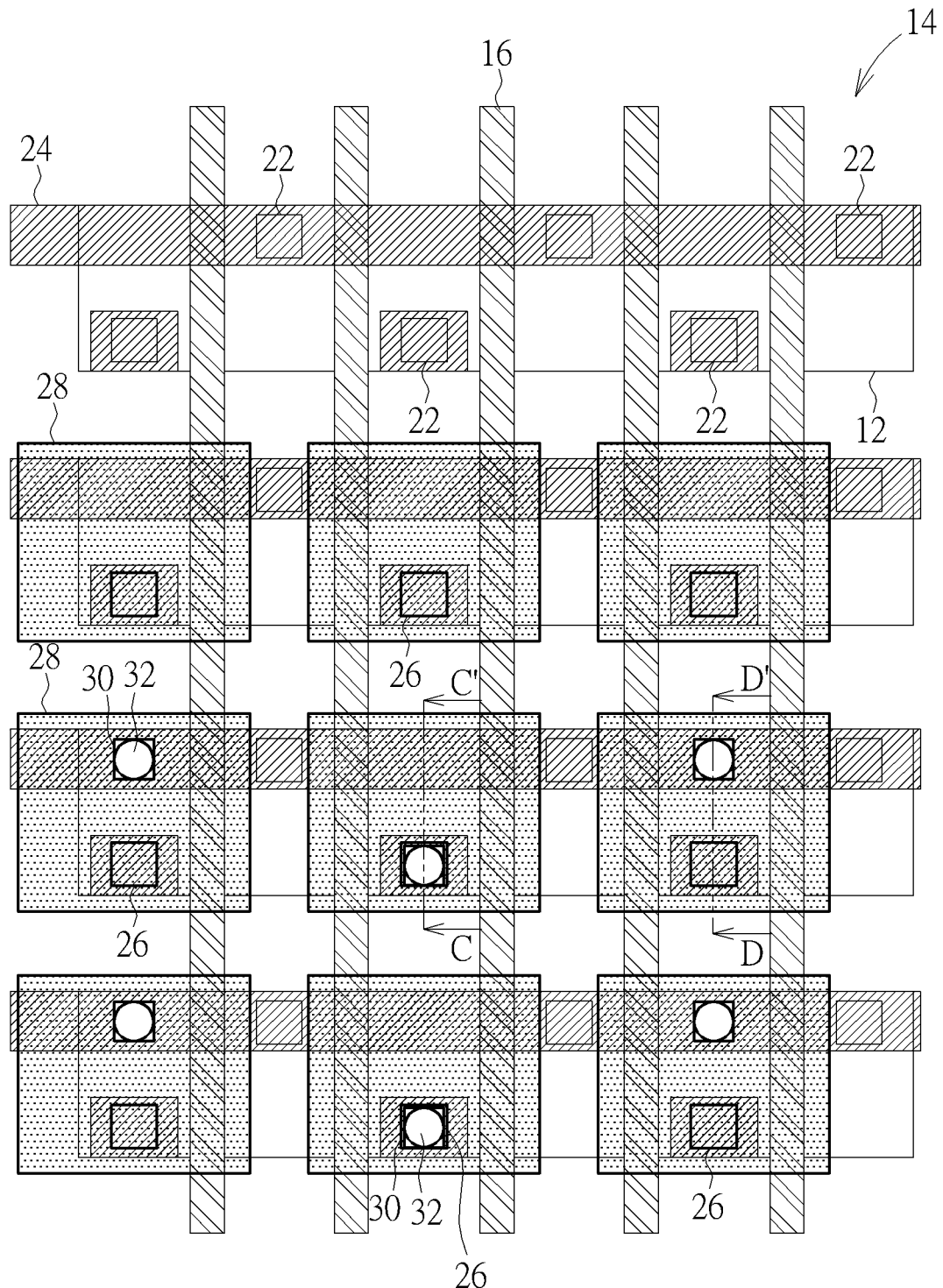
FIG. 3 illustrates a top view of a semiconductor device according to an embodiment of the present invention.
Figure 4:
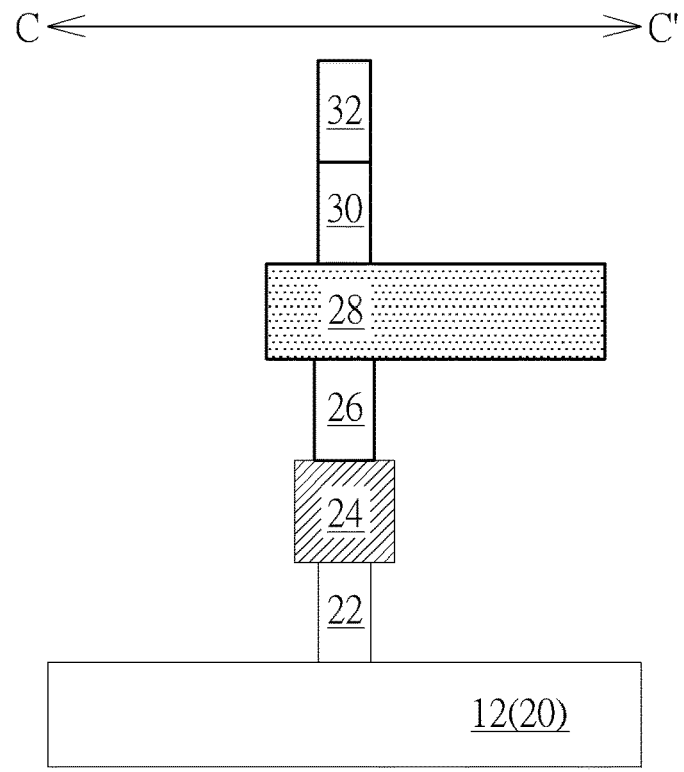
FIG. 4 illustrates cross-sectional views of FIG. 3 along the sectional lines CC' and DD'.
Figure 4:
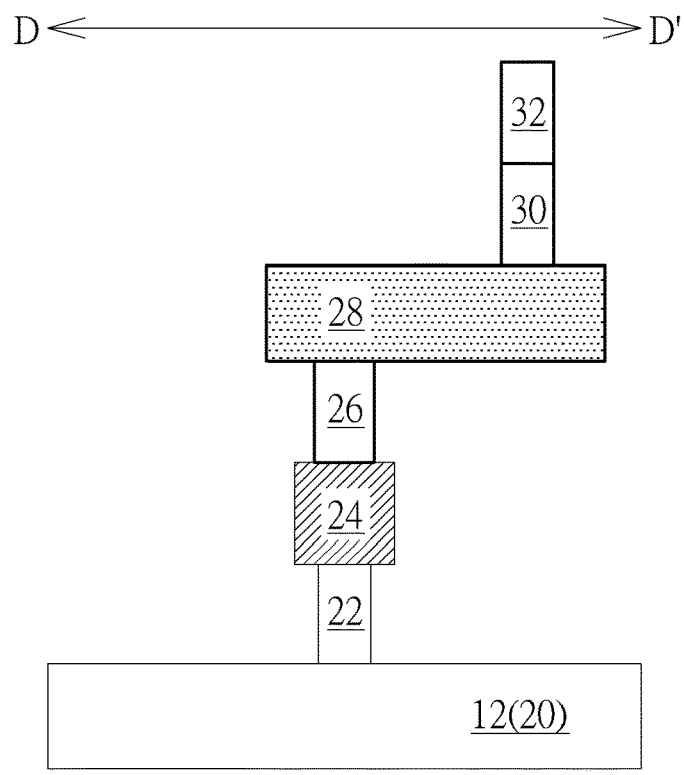

Referring to FIGS. 1-4, FIGS. 1 and 3 illustrate layout top views of a semiconductor device, or more specifically a MRAM device according to an embodiment of the present invention, the top portion of FIG. 2 illustrates a cross-section of FIG. 1 along the sectional line AA', the bottom portion of FIG. 2 illustrates a cross-section of FIG. 1 along the sectional line BB', the top portion of FIG. 4 illustrates a cross-section of FIG. 3 along the sectional line CC', the bottom portion of FIG. 4 illustrates a cross-section of FIG. 3 along the sectional line DD'. As shown in FIGS. 1-4, the MRAM device preferably includes a substrate 12 made of semiconductor material, in which the semiconductor material could be selected from the group consisting of silicon (Si), germanium (Ge), Si—Ge compounds, silicon carbide (SiC), and gallium arsenide (GaAs). A MRAM region 14 and a periphery region (not shown) surrounding the MRAM region 14 are defined on the substrate 12.

Active devices such as metal-oxide semiconductor (MOS) transistors, passive devices, conductive layers, and interlayer dielectric (ILD) layer could also be formed on top of the substrate 12. More specifically, planar MOS transistors or non-planar (such as FinFETs) MOS transistors could be formed on the substrate 12, in which the MOS transistors could include transistor elements such as gate structures such as word lines 16, source/drain regions 20, spacers, epitaxial layers, and contact etch stop layer (CESL). The ILD layer could be formed on the substrate 12 to cover the MOS transistors, and a plurality of contact plugs 22 could be formed in the ILD layer to electrically connect to the gate structure and/or source/drain regions 20 of MOS transistors. Since the fabrication of planar or non-planar transistors and ILD layer is well known to those skilled in the art, the details of which are not explained herein for the sake of brevity.

The semiconductor device also includes metal interconnections 24 disposed on the ILD layer, metal interconnections 26, 28, 30 disposed on the metal interconnections 24, MTJ 32 disposed on the metal interconnection 30, and inter-metal dielectric (IMD) layer (not shown) surrounding the metal interconnections 24, 26, 28, 30, and the MTJ 32. In this embodiment, each of the metal interconnections 24, 26, 28, 30 could be fabricated according to a single damascene or dual damascene process and embedded in the IMD layer and/or stop layer while electrically connected to each other. For instance, each of the metal interconnections 24 could include a trench conductor, the metal interconnection 26 could include a via conductor, the metal interconnection 28 could include a trench conductor, and the metal interconnection 30 could include a via conductor. Preferably, the metal interconnection 24 could also be referred to as the first level metal interconnection M1, the metal interconnection 26 could also be referred to as the first level via conductor V1, the metal interconnection 28 could be referred to as the second level metal interconnection M2, and the metal interconnection 30 could be referred to as the second level via conductor V2.

Moreover, each of the metal interconnections 24, 26, 28, 30 could further includes a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers are preferably made of copper, the IMD layers are preferably made of silicon oxide, and the stop layers are preferably made of nitrogen doped carbide (NDC), silicon nitride, silicon carbon nitride (SiCN), or combination thereof.

In this embodiment, the MTJ 32 could include a bottom electrode disposed on the metal interconnection 30, a MTJ stack disposed on the bottom electrode, and a top electrode disposed on the MTJ stack, in which the MTJ stack preferably includes a pinned layer, a barrier layer, and a free layer. Specifically, each of the bottom electrode and the top electrode are preferably made of conductive material including but not limited to for example Ta, Pt, Cu, Au, Al, or combination thereof. The pinned layer could be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field.

It should be noted that even though the MTJ 32 on top portion of FIG. 2 and the MTJ 32 on bottom portion of FIG. 2 are both disposed directly on top of the contact plug 22, according to other embodiment of the present invention, it would also be desirable to move the MTJs 32 freely within the boundary of metal interconnection 28 or second level metal interconnection M2 according to the staggered arrangement of MTJs 32 shown in FIG. 1 or FIG. 3. For instance, it would be desirable to overlap the MTJ 32 and the contact plug 22 as shown in FIGS. 2 and 4 or not overlapping the MTJs 32 and contact plugs 22 underneath as shown FIGS. 1 and 3, which are all within the scope of the present invention. Moreover, the contact plug 22 directly under the MTJ 32 shown on top portion of FIG. 2 is preferably connected to a drain region (not shown) while the two contact plugs 22 adjacent two sides of the drain region are connected to a source region. Conversely, the contact plug 22 directly under the MTJ 32 on bottom portion of FIG. 2 is connected to a source region while the two contact plugs 22 on right side of the source region including the middle contact plug 22 is connected to a drain region and the right contact plug is connected to another source region.

Figure 5:
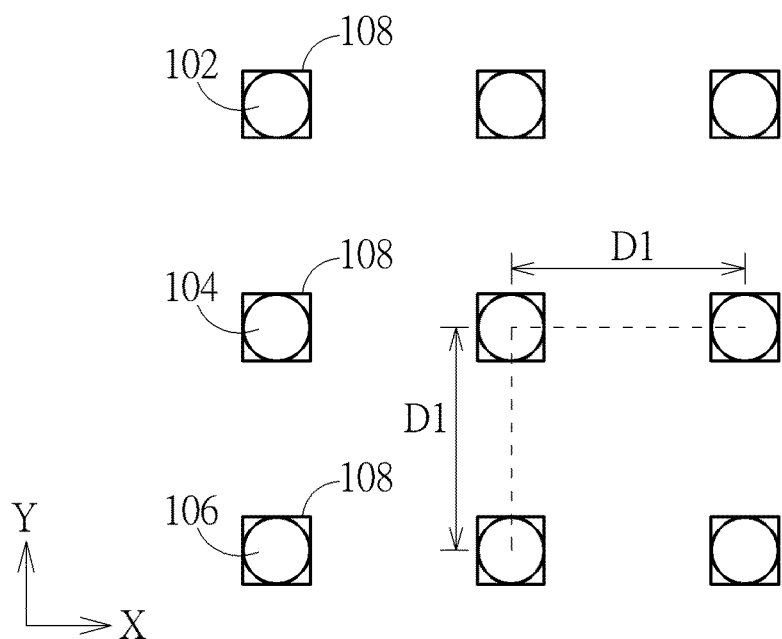
FIG. 5 illustrates a layout pattern of MTJs within MRAM unit according to an embodiment of the present invention.

Referring to FIG. 5, FIG. 5 illustrates a layout pattern of adjacent MTJs and metal interconnections within a MRAM unit generated after optical proximity correction (OPC) process according to a conventional art. As shown in FIG. 5, the layout pattern of the MRAM unit preferably includes multiple columns such as three columns of pattern combination constituted by MTJ patterns and metal interconnection patterns arranged according to an array, in which each column includes a plurality of MTJ patterns (represented by circular patterns) and a plurality of via patterns (represented by square patterns) under each of the MTJ patterns arranged according to a straight line. For instance, the layout pattern on the left column preferably includes a first MTJ pattern 102, a second MTJ pattern 104, a third MTJ pattern 106, and via patterns 108 all arranged according to a straight line manner on the substrate 12. Preferably, the first MTJ pattern 102, the second MTJ pattern 104, and the third MTJ pattern 106 are arranged from top to bottom to constitute a straight line altogether according to a top view perspective, and the via patterns 108 overlapping each of the first MTJ pattern 102, the second MTJ pattern 104, and the third MTJ pattern 106 underneath are also arranged according to a straight line.

It should be noted that since the aforementioned embodiment of placing the MTJ patterns and via patterns along a straight line could shorten the distance between adjacent MTJs such as by shortening the distance D1 between centers of adjacent MTJs and result in contamination, the following embodiments of the present invention preferably adjust the arrangements among MTJ patterns and/or via patterns so that the MTJ patterns would not be too close to each other thereby minimizing the chance of contamination.

Figure 6:
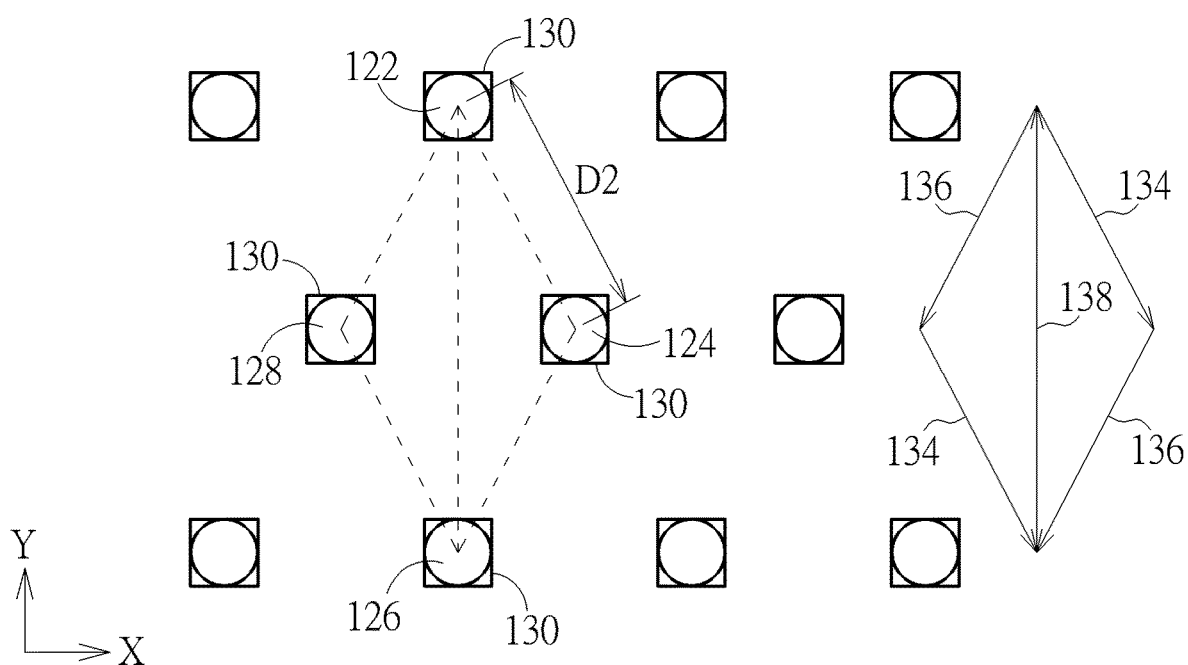
FIG. 6 illustrates a layout pattern of MTJs within MRAM unit according to an embodiment of the present invention.

Referring to FIG. 6, FIG. 6 illustrates a layout pattern of adjacent MTJs and metal interconnections within a MRAM unit generated after optical proximity correction (OPC) process. As shown in FIG. 6, the layout pattern of the MRAM unit preferably includes multiple columns of pattern combination constituted by MTJ patterns (such as the MTJ 32 shown in FIGS. 1-4) and via patterns (such as the metal interconnections 30 directly under the MTJ 32 shown in FIGS. 1-4) arranged according to an array with staggered arrangement. For instance, the layout pattern from the second column to the fourth column from the left preferably includes a first MTJ pattern 122 disposed on the substrate 12, a second MTJ pattern 126 disposed under or below the first MTJ pattern 122, a third MTJ pattern 124 disposed between the first MTJ pattern 122 and the second MTJ pattern 126, a fourth pattern 128 disposed between the first MTJ pattern 122 and the second MTJ pattern 126 and opposite to the third MTJ pattern 124, and via patterns 130 under and overlapping the first MTJ pattern 122, the second MTJ pattern 126, the third MTJ pattern 124, and the fourth MTJ pattern 128, in which the first MTJ pattern 122, the second MTJ pattern 126, the third MTJ pattern 124, the fourth MTJ pattern 128, and the via patterns 130 are arranged according to a staggered arrangement. Similar to the aforementioned embodiment, the MTJ patterns 122, 124, 126, 128 are represented by circular patterns while the via patterns 130 underneath are represented by square patterns.

Specifically, the third MTJ pattern 124 is disposed along a first direction 134 relative to the first MTJ pattern 122, the second MTJ pattern 126 is disposed along a second direction 136 relative to the third MTJ pattern 124, the second MTJ pattern 126 is disposed along a third direction 138 (such as Y-direction) relative to the first MTJ pattern 122, and the fourth MTJ pattern 128 is also disposed along the same first direction 134 relative to the second MTJ pattern 126 while the fourth MTJ pattern 128 is also disposed along the second direction 136 relative to the first MTJ pattern 122, in which the angle included by the first direction 134 and the third direction 138 is less than 90 degrees, the angle included by the second direction 136 and the third direction 138 is less than 90 degrees, and the angle included by the first direction 134 and the second direction 136 could be less than, equal to, or greater than 90 degrees.

Viewing from an overall perspective, the positions of the first MTJ pattern 122, the second MTJ pattern 126, and the third MTJ pattern 124, such as the central points of the first MTJ pattern 122, second MTJ pattern 126, and third MTJ pattern 124 together constitute a triangle while the central points of the first MTJ pattern 122, second MTJ pattern 126, and fourth MTJ pattern 128 also constitute another triangle that is preferably a mirror image of the triangle formed by the first MTJ pattern 122, second MTJ pattern 126, and third MTJ pattern 124. The center points of first MTJ pattern 122, second MTJ pattern 126, third MTJ pattern 124, and fourth MTJ pattern 128 also constitute a rhombus altogether.

Viewing from another perspective, the first direction 134 extended from the center or central point of the first MTJ pattern 122 to the center of the third MTJ pattern 124, the second direction 136 extended from the center of the third MTJ pattern 124 to the center of the second MTJ pattern 126, and the third direction 138 extended from the center of the first MTJ pattern 122 to the center of the second MTJ pattern 126 preferably constitute a triangle. Similarly, the second direction 136 extended from the center of the first MTJ pattern 122 to the center of the fourth MTJ pattern 128, the first direction 134 extended from the center of the fourth MTJ pattern 128 to the center of the second MTJ pattern 126, and the third direction 138 extended from the center of the second MTJ pattern 126 to the center of the first MTJ pattern 122 also constitute another triangle.

Moreover, the first direction 134 extended from the center or central point of the first MTJ pattern 122 to the center of the third MTJ pattern 124, the second direction 136 extended from the center of the third MTJ pattern 124 to the center of the second MTJ pattern 126, the second direction 136 extended from the center of the first MTJ pattern 122 to the center of the fourth MTJ pattern 128, and the first direction 134 extended from the center of the fourth MTJ pattern 128 to the center of the second MTJ pattern 126 together constitute a rhombus, in which the distance between the center of the first MTJ pattern 122 and the center of the second MTJ pattern 126 is preferably different from the distance between the center of the third MTJ pattern 124 and the center of the fourth MTJ pattern 128.

It should be noted that the triangle constituted by the aforementioned combination of patterns or the three directions 134, 136, 138 could include all types of triangles such as equilateral triangle, isosceles triangle, right angle triangle, or any irregular triangle, and the rhombus formed by four directions 134 and 136 is also not limited to the one disclose above. For instance, the distance between the center of the first MTJ pattern 122 and the center of the second MTJ pattern 126 could be less than, equal to, or greater than the distance between the center of the third MTJ pattern 124 and the center of the fourth MTJ pattern 128. Since all the via patterns 130 overlap the MTJ patterns, the via patterns 130 could also be arranged in the same manner as the MTJ patterns disclosed above and the detailed of which are not explained herein for the sake of brevity.

Overall, by positioning the MTJ patterns according to a staggered manner in this embodiment, a shortest distance D2 measured from the center of the first MTJ pattern 122 to the center of the third MTJ pattern 124 would then correspond to a hypotenuse of a triangle as opposed to a cathetus as disclosed in the embodiment shown in FIG. 5. As a result, the shortest distance D2 between the centers of each of the MTJ patterns would be greater than the shortest distance D1 between the MTJ patterns disclosed in the embodiment shown in FIG. 5. By following this design it would be desirable to increase the distance between adjacent MTJs thereby avoiding contamination.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern for magnetoresistive random access memory (MRAM), comprising:
    a first word line, a second word line, and a third word line on a substrate;
    a first magnetic tunneling junction (MTJ) pattern between the first word line and the second word line;
    a second MTJ pattern adjacent to the first MTJ pattern and between the first word line and the second word line;
    a third MTJ pattern between the first MTJ pattern and the second MTJ pattern and between the second word line and the third word line, wherein the first MTJ pattern, the second MTJ pattern, and the third MTJ pattern comprise a staggered arrangement;
    a first metal interconnection pattern directly under the first MTJ pattern, wherein the first metal interconnection pattern overlaps the first word line and the first MTJ patterns; and
    a second metal interconnection pattern directly under the third MTJ pattern, wherein the second metal interconnection pattern overlaps the third word line and the third MTJ pattern.

2. The layout pattern for MRAM of claim 1, wherein the third MTJ pattern is disposed along a first direction relative to the first MTJ pattern, the second MTJ pattern is disposed along a second direction relative to the third MTJ pattern, and the second MTJ pattern is disposed along a third direction relative to the first MTJ pattern, wherein the first direction, the second direction, and the third direction comprise a triangle.

3. The layout pattern for MRAM of claim 1, wherein an angle included by the first direction and the third direction is less than 90 degrees.

4. The layout pattern for MRAM of claim 1, wherein an angle included by the second direction and the third direction is less than 90 degrees.

5. The layout pattern for MRAM of claim 1, further comprising a fourth MTJ pattern disposed along the second direction relative to the first MTJ pattern.

6. The layout pattern for MRAM of claim 5, wherein the fourth MTJ pattern is disposed along the first direction relative to the second MTJ pattern.

7. The layout pattern for MRAM of claim 5, wherein the first MTJ pattern, the second MTJ pattern, the third MTJ pattern, and a fourth MTJ pattern comprise a rhombus.

8. The layout pattern for MRAM of claim 5, wherein a distance between the first MTJ pattern and the second MTJ pattern is different from a distance between the third MTJ pattern and the fourth MTJ pattern.

* * * * *